(12) United States Patent
Hsu

(10) Patent No.: US 7,532,477 B2
(45) Date of Patent: May 12, 2009

(54) MEMORY MODULE AND HEAT SINK ARRANGEMENT

(75) Inventor: Chi-Feng Hsu, Shulin (TW)

(73) Assignee: June-On Co., Ltd., Taipei Hsien (TW)

( * ) Notice: Subject to any disclaimer, the term of this patent is extended or adjusted under 35 U.S.C. 154(b) by 150 days.

(21) Appl. No.: 11/625,798

(22) Filed: Jan. 22, 2007

(65) Prior Publication Data
US 2008/0174965 A1 Jul. 24, 2008

(51) Int. Cl.
*H05K 7/20* (2006.01)
(52) U.S. Cl. .................. 361/704; 361/719; 165/80.3
(58) Field of Classification Search ............... 361/704, 361/710, 715, 719, 700; 257/707–709, 717–719; 165/80.3, 185, 80.4, 104.26, 104.33; 174/16.3
See application file for complete search history.

(56) References Cited

U.S. PATENT DOCUMENTS

| | | | |
|---|---|---|---|
| 6,765,797 B2 * | 7/2004 | Summers et al. ............ | 361/704 |
| 7,221,569 B2 * | 5/2007 | Tsai ........................... | 361/704 |
| 7,349,219 B2 * | 3/2008 | Lai et al. ..................... | 361/719 |
| 7,349,220 B2 * | 3/2008 | Lai et al. ..................... | 361/719 |
| 7,391,613 B2 * | 6/2008 | Lai et al. ..................... | 361/700 |
| 7,400,506 B2 * | 7/2008 | Hoss et al. .................. | 361/715 |
| 2003/0026076 A1 * | 2/2003 | Wei ............................. | 361/704 |
| 2007/0165382 A1 * | 7/2007 | Yu et al. ...................... | 361/704 |

* cited by examiner

*Primary Examiner*—Jayprakash N Gandhi
*Assistant Examiner*—Courtney Smith

(57) ABSTRACT

A memory module and heat sink arrangement is disclosed to include a memory module, two heat sinks attached to two opposite sides of a memory chip of the memory module, each heat sink having a mounting unit at a top side and multiple retaining spring strips suspending below the mounting unit, and multiple clamps respectively clamped on the two heat sinks and engaged with the retaining spring strips of the two heat sinks and respectively stopped between guide blocks at the two heat sinks to hold respective locating plugs of one of the two heat sinks in engagement with respective locating grooves of the other of the two heat sinks.

7 Claims, 6 Drawing Sheets

MEMORY MODULE AND HEAT SINK ARRANGEMENT

BACKGROUND OF THE INVENTION

1. Field of the Invention

The present invention relates to heat sinks and more particularly, to a memory module and heat sink arrangement, which uses clamps to secure two sink sinks and a memory module in between the two sink sinks for allow quick dissipation of heat energy from the memory module during the operation of the memory module.

2. Description of the Related Art

Following fast development of computer technology, sophisticated and high operation speed computers have been continuously created. During the operation of a computer, many computer internal electronic devices and memory modules will emit heat. From early PC100 with bandwidth 800 MB/s to the modern DDR500 with bandwidth 4.0 GB/s or the advanced dual-rank design, memory working time-pulse or transmission bandwidth is developing toward a high speed to fit the high speed operation of the processor. During a high speed operation of a memory module, the temperature of the heat energy emitted by the memory module will increase continuously, and an excessive high temperature will affect the performance or normal functioning of the memory module.

In order to dissipate heat from a memory module during its operation, heat sinks may be used. FIG. 6 shows a conventional heat sink and memory module arrangement. According to this arrangement, two heat sinks A are respectively attached to two opposite sides of a memory module D, two heat transfer bonding pads C are respectively sandwiched between the two opposite sides of the memory module D and the two heat sinks A, and two clamps B are respectively clamped on the two heat sinks A to secure the heat sinks A, the heat transfer bonding pads C and the memory module D together. According to this design, the two heat sinks A each have a plurality of hooks A2 and hook holes A3. By engaging the hooks A2 of one of the two heat sinks A into the hook holes A3 of the other of the two heat sinks A, the two heat sinks A are fastened together. Further, each of the two heat sinks A has a plurality of substantially U-shaped locating grooves A4 raised from an outside wall A1 for securing the clamps B. This design of heat sink and memory module arrangement still has drawbacks as follows:

1. The hooks A2 may be forced away from the associating hook holes A3 by an external force accidentally, causing displacement of the two heat sinks A relative to the memory module D.

2. The two heat sinks A are bonded to the two opposite sides of the memory module D by the heat transfer bonding pads C, and the clamps B are engaged in the U-shaped locating grooves A4 on the outside wall A1 of each of the two heat sinks A. When wishing to detach the two heat sinks A from the memory module D, a pry or like tool must be used to damage the U-shaped locating grooves A4 for allowing removal of the clamps B from the heat sinks A so that the two heat sinks A can be further detached from the memory module D.

Therefore, it is desirable to provide a memory module and heat sink arrangement that eliminates the aforesaid drawbacks.

SUMMARY OF THE INVENTION

The present invention has been accomplished under the circumstances in view. According to one aspect of the present invention, the memory module and heat sink arrangement comprises two heat sinks, a memory module sandwiched between the two heat sinks and carrying a memory chip, and a plurality of clamps that secure the two heat sinks together. The two heat sinks each comprise a flat base, a bonding surface formed on the flat base at an inner side and bonded to one of the two opposite sides of the memory chip, a mounting unit disposed at the top side of the flat base, and a plurality of retaining spring strips respectively extended from the flat base for securing the clamps. The mounting unit of one of the two heat sinks comprises a plurality of locating plugs, and the mounting unit of the other of the two heat sinks comprises a plurality of locating grooves. The locating lugs of one of the two heat sinks are respectively engaged into the locating grooves of the other of the two heat sinks. The clamps are clamped on the two heat sinks at a top side. Each clamp has two clamping arms respectively clamped on one retaining spring strip of each of the two heat sinks. The clamping arms each have a retaining hole for the engagement of the associating retaining spring strip. By means of the engagement between the respective locating plugs and the respective locating grooves and the clamping force of the clamps, the two heat sinks and the memory module are firmly secured together.

According to another aspect of the present invention, the clamps can easily be removed from the two heat sinks by forcing the retaining spring strips inwardly away from the retaining holes of the clamping arms of the clamps. After removal of the clamps from the two heat sinks, the two heat sinks can be detached from the memory module.

According to still another aspect of the present invention, a heat transfer compound is applied to the bonding surfaces of the two heat sinks to seal a gap between the two heat sinks and the memory chip of the memory module and to enhance the heat dissipation efficiency of the two heat sinks.

DETAILED DESCRIPTION OF THE PREFERRED EMBODIMENT

Figure 1:
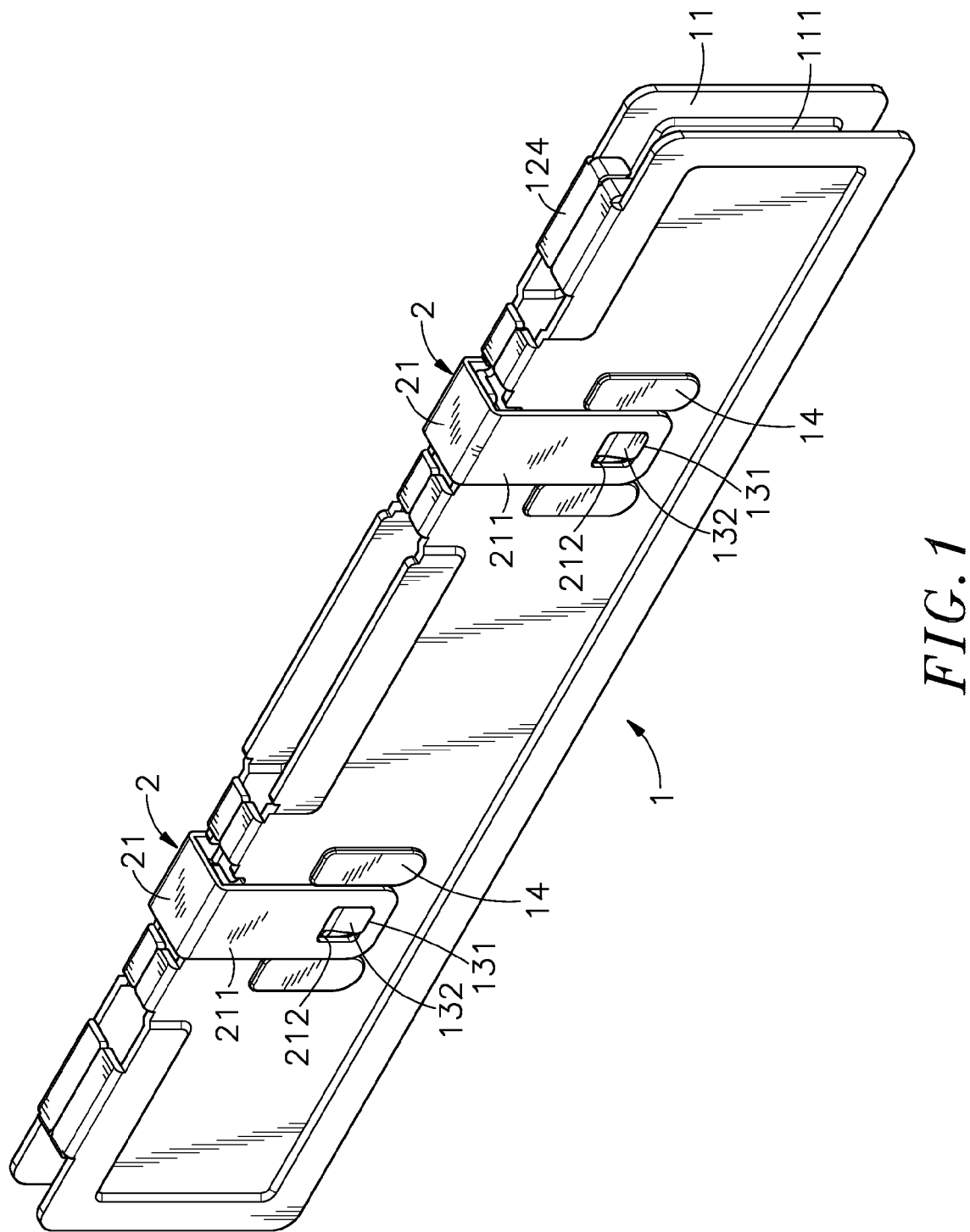
FIG. 1 is an oblique elevation of the preferred embodiment of the present invention.
Figure 2:
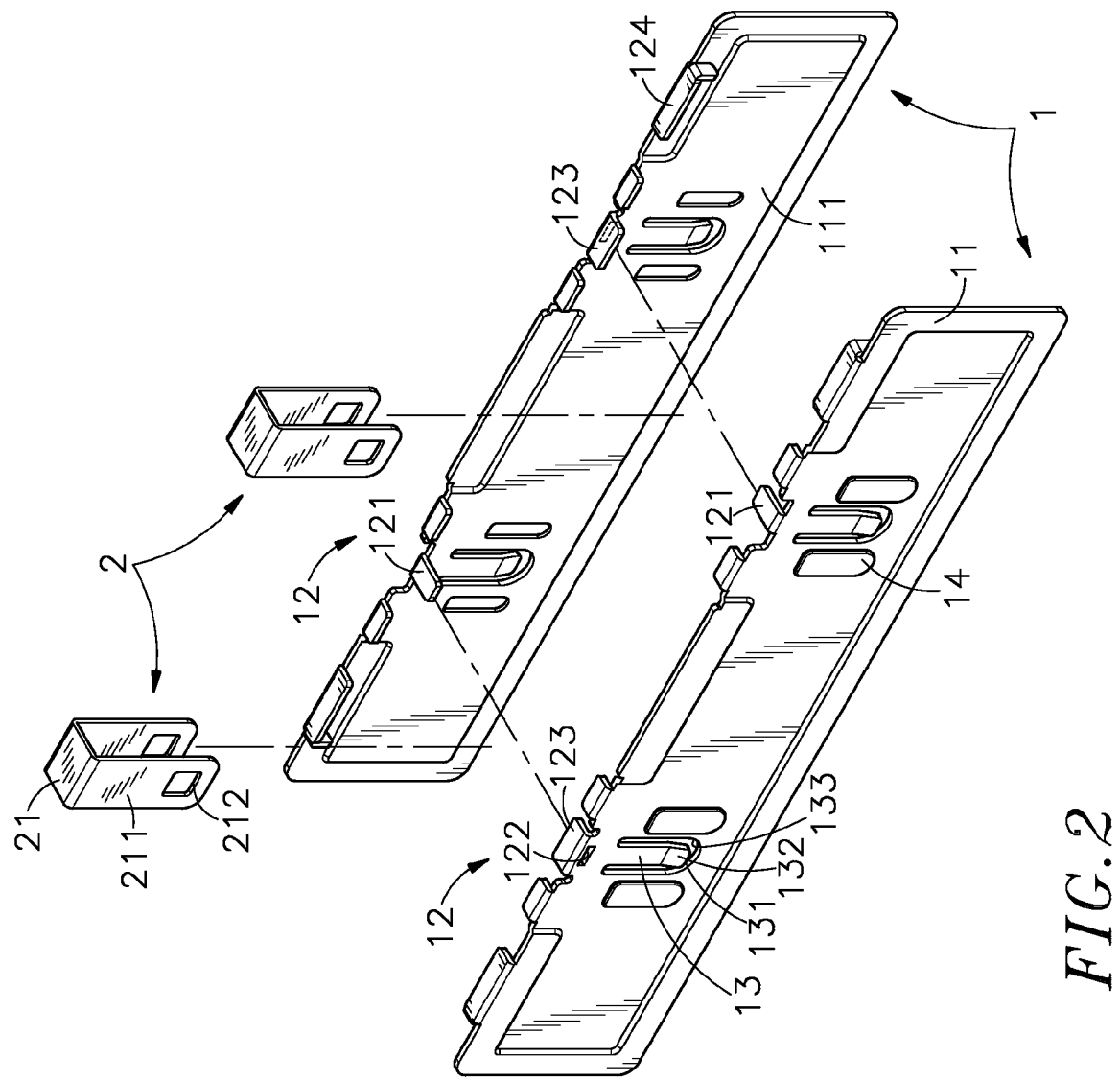
FIG. 2 is an exploded view of the preferred embodiment of the present invention.
Figure 3:
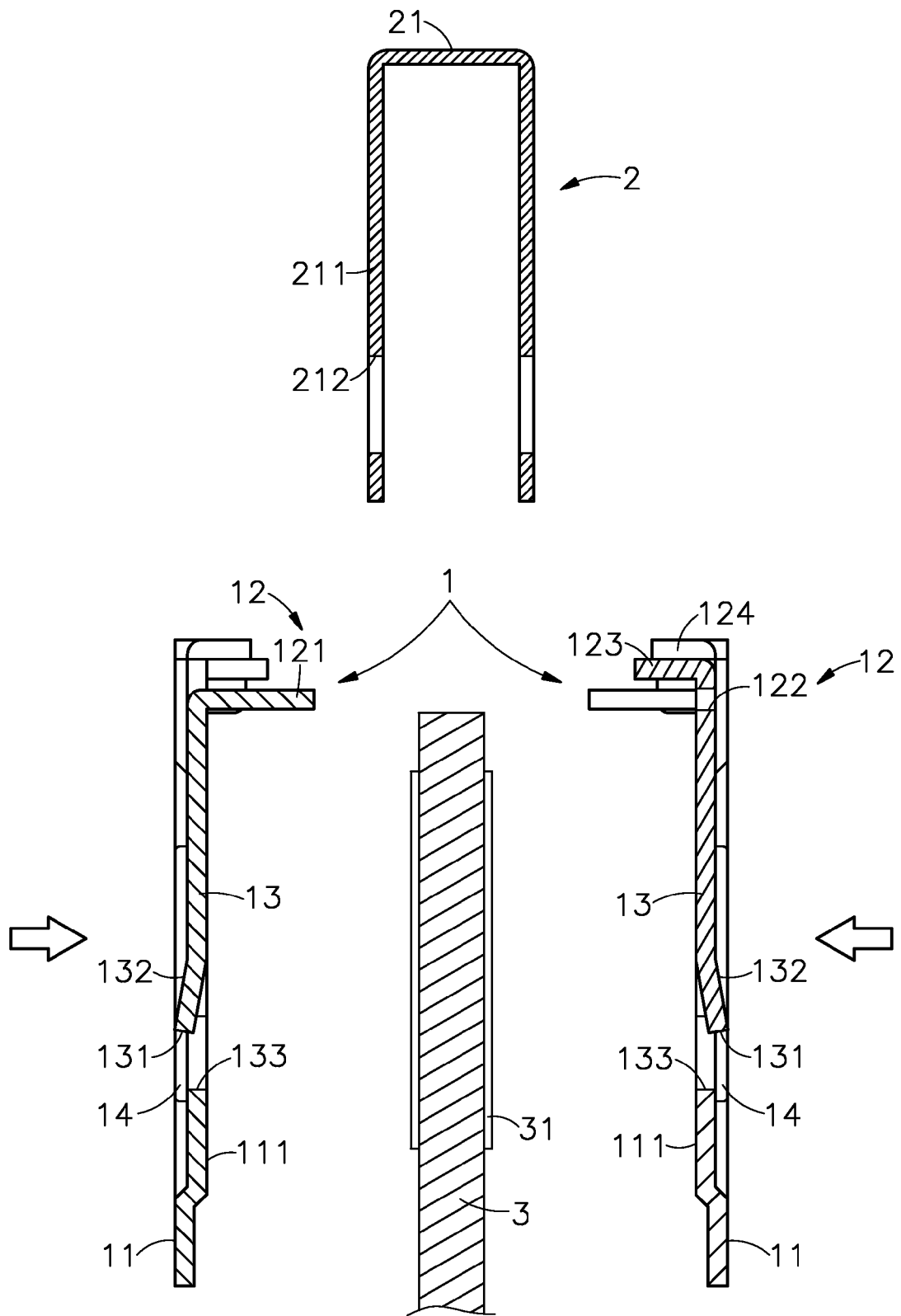
FIG. 3 is a sectional side view showing the assembly procedure of the preferred embodiment of the present invention (I).

Referring to FIGS. 1~3, the preferred embodiment of the present invention is shown comprising two heat sinks 1, a plurality of clamps 2 and a memory module 3.

The two heat sinks 1 are flat metal members each having a flat base 11, a mounting unit 12 provided at the top side of the flat base 11 for mounting, a plurality of openings 133 formed on the flat base 11, a plurality of retaining spring strips 13 respectively formed of a part of the flat base 11 and respectively downwardly suspending in the openings 133, and pairs of guide blocks 14 respectively protruded from the flat base 11 at two sides of each of the retaining spring strips 13. The flat base 11 has a smooth bonding surface 111 disposed at an inner side for the bonding of one of the two opposite sides of a memory chip 31 of the memory module 3. The mounting unit 12 comprises a plurality of locating plugs 121, a plurality of locating grooves 122, a plurality of bearing blocks 123 respectively disposed above the locating grooves 122, and a plurality of stop blocks 124 for stopping the memory module 3 in between the two heat sinks 1. Each retaining spring strip 13 has a bottom free end terminating in a guide slope 132 and then a retaining tip 131.

The clamps 2 are adapted to clamp the two heat sinks 1, each having a flat base 21 and two clamping arms 211. The clamping arms 211 are respectively downwardly extending from the flat base 21 at two sides, each having a retaining hole 212 near the bottom end for securing the corresponding retaining spring strip 13.

Figure 4:
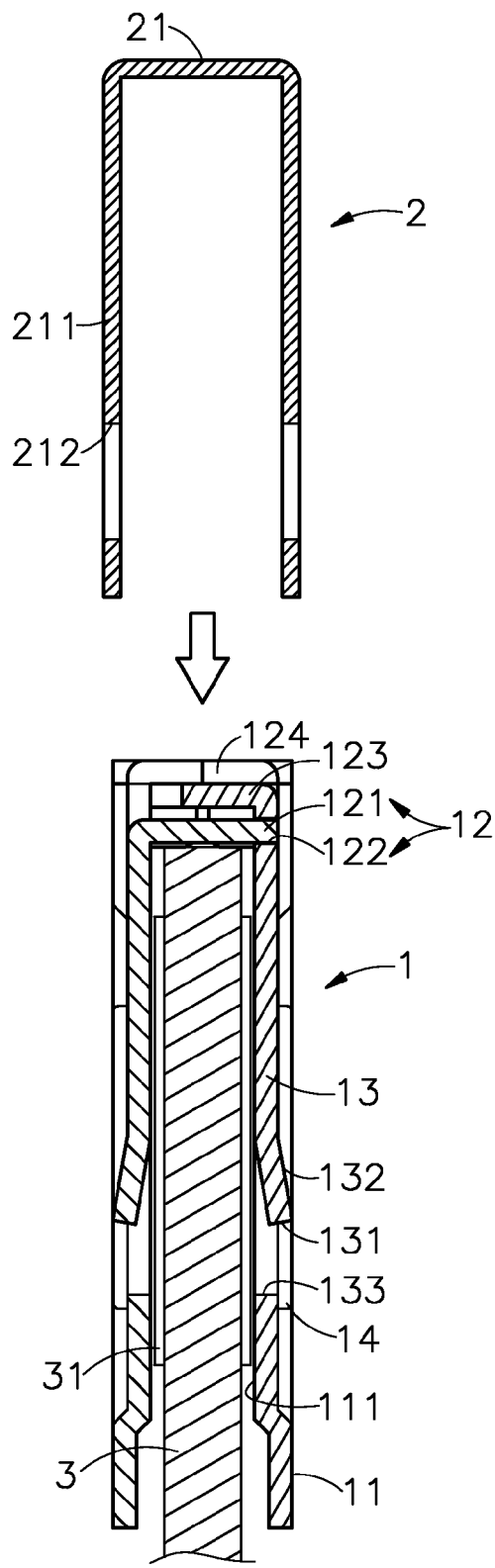
FIG. 4 is a sectional side view showing the assembly procedure of the preferred embodiment of the present invention (II).
Figure 5:
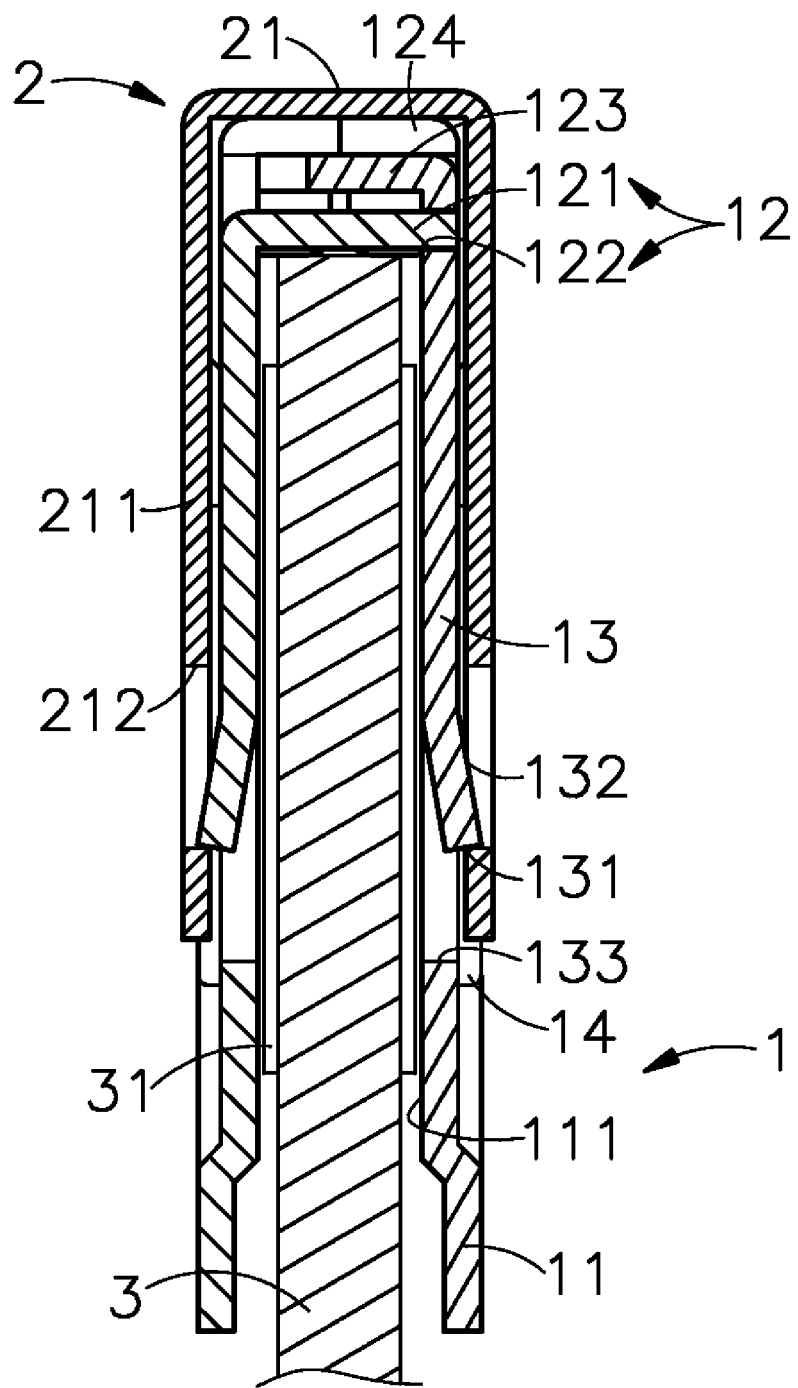
FIG. 5 is a sectional side view showing the assembly procedure of the preferred embodiment of the present invention (III).
Figure 6:
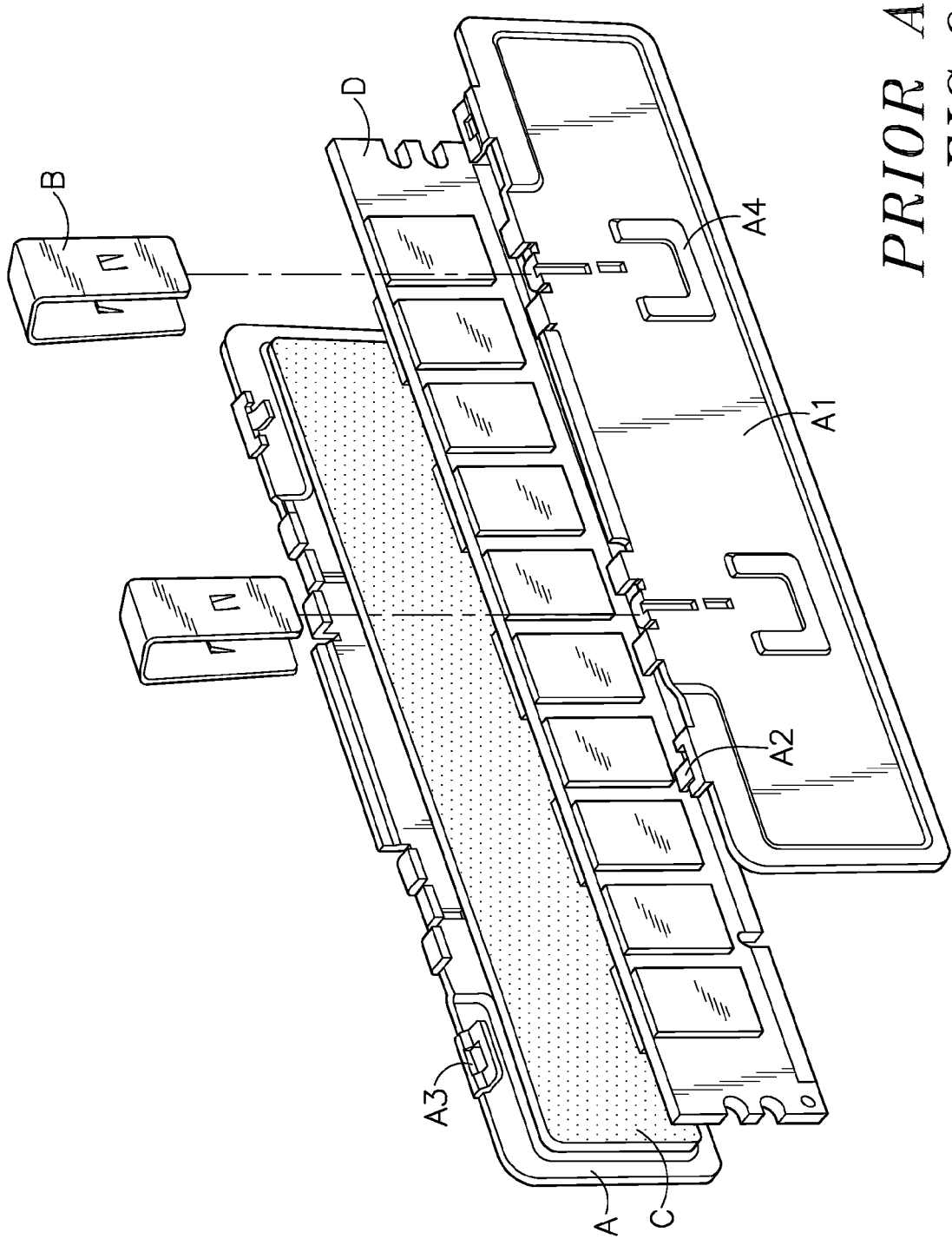
FIG. 6 is an exploded view of the prior art design.

Referring to FIGS. 4 and 5 and FIGS. 2 and 3 again, during assembly process, the memory module 3 is put in between the two heat sinks 1 to have the two opposite sides of the memory chip 31 of the memory module 3 be respectively bonded to the bonding surfaces 111 of the flat bases 11 of the heat sinks 1 and the locating plugs 121 of one of the two heat sinks 11 be engaged into the locating grooves 122 of the other of the two heat sink 11 respectively. At this time, the bearing blocks 123 of one of the two heat sinks 11 are respectively stopped at the locating plugs 121 of the other of the two heat sinks 11 at the top, and the stop blocks 124 support the memory module 3 in place. Thereafter, the clamps 2 are fastened to the two heat sinks 1 by clamping the clamping arms 211 on the retaining spring strip 13 of the two heat sinks 1 and then forcing the clamps 2 downwards into a gap in each pair of guide blocks 14 along the guide slopes 132 of the retaining spring strips 13 to have the retaining holes 212 of the clamping arms 211 be forced into engagement with retaining tips 131 of the retaining spring strips 13 respectively. After engagement of the retaining holes 212 of the clamping arms 211 of the clamps 2 with the retaining tips 131 of the retaining spring strips 13, the retaining tips 131 of the retaining spring strips 13 stop the clamps 2 from backward movement, the guide blocks 14 stop the clamps 2 from horizontal displacement, and at the same time the flat bases 21 of the clamps 2 are stopped at the top edge of each of the two heat sinks 1, and therefore the clamps 2 are positively secured to the two heat sinks 1 to hold the two heat sinks 1 and the memory module 3 firmly together.

The two heat sinks 1 are made of a metal material having a high coefficient of heat transfer, for example, aluminum or copper. Further, a heat transfer compound is applied to the bonding surface 111 of the flat base 11 of each of the two heat sinks 1 before attaching the two heat sinks 1 to the memory chip 31 of the memory module 3. The applied heat transfer compound seals a gap between the bonding surface 111 of the flat base 11 of each of the two heat sinks 1 and the memory chip 31 of the memory module 3, and enhances the heat dissipation efficiency of the two heat sinks 1.

Referring to FIGS. 3-5 again, when dismounting the two heat sinks 1 from the memory module 3, press the retaining tips 131 of the retaining spring strips 13 inwardly away from the respective retaining holes 212 for enabling the clamps 2 to be moved away from the two heat sinks 1, and then the two heat sinks 1 are detached from the memory module 3.

Further, when clamping the two clamping arms 211 of each clamp 2 on the two heat sinks 1, the two clamping arms 211 impart a pressure to the two heat sinks 1 against the two opposite sides of the memory module 3, holding the bearing blocks 123 of one of the two heat sinks 11 positively above the locating plugs 121 of the other of the two heat sinks 11, and therefore the bearing blocks 123 stop the associating locating plugs 121 in the corresponding locating grooves 122. Because the locating plugs 121 of one of the two heat sinks 1 are respectively engaged into the locating grooves 122 of the other of the two heat sinks 1, the clamping force of the clamps 2 that is applied to the memory module 3 is limited to a certain extent and will not cause the memory chip 31 of the memory module 3 to break.

Further, when the retaining tips 131 of the retaining spring strips 13 are respectively engaged into the retaining holes 212 of the clamping arms 211 of the clamps 2, the clamps 2 are prohibited from backward displacement relative to the two heat sinks 1, and at the same time the guide blocks 14 are respectively stopped at two sides of each of the clamps 2 to prohibit the clamps 2 from horizontal displacement, and therefore the clamps 2, the two heat sinks 1 and the memory module 3 are firmly secured together.

As indicated above, the invention provides a memory module and heat sink arrangement, which has the following features:

1. The bonding surfaces 111 of the two heat sinks 1 are respectively bonded to the two opposite sides of the memory chip 31 of the memory module 3 to have the respective locating plugs 121 be engaged into the respective locating grooves 122 and the respective bearing blocks 123 be stopped above the respective locating plugs 121 so that the stop blocks 124 support the memory module 3 firmly in place. Further, the clamps 2 are clamped on the two heat sinks 1 to hold the heat sinks 1 and the memory module 3 firmly together.

2. The two clamping arms 211 of each of the clamps 2 are respectively clamped on the retaining spring strips 13 of the two heat sinks 1 and then moved downwards along the guide slopes 132 of the retaining spring strips 13 to force the respective retaining holes 212 into engagement with the respective retaining tips 131 of the retaining spring strips 13. After installation of the clamps 2, the clamps 2 impart a pressure to the two heat sinks 1 against the two opposite sides of the memory module 3, thereby holding the heat sinks 1 and the memory module 3 firmly together. However, because the locating plugs 121 of one of the two heat sinks 1 are respectively engaged into the locating grooves 122 of the other of the two heat sinks 1, the clamping force of the clamps 2 that is applied to the memory module 3 is limited to a certain extent and will not cause the memory chip 31 of the memory module 3 to break.

3. When pressing the retaining tips 131 of the retaining spring strips 13 inwardly away from the respective retaining holes 212, the clamps 2 can be moved away from the two heat sinks 1, for allowing dismounting of the two heat sinks 1 from the memory module 3.

4. A heat transfer compound is applied to the bonding surface 111 of each of the two heat sinks 1 before attaching the two heat sinks 1 to the memory chip 31 of the memory module 3. The applied heat transfer compound seals a gap between the bonding surface 111 of each of the two heat sinks 1 and the memory chip 31 of the memory module 3, and enhances the heat dissipation efficiency of the two heat sinks 1.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A memory module and heat sink arrangement comprising two heat sinks, a memory module sandwiched between said two heat sinks and carrying a memory chip, and a plurality of clamps that secure said two heat sinks together, wherein said two heat sinks each comprise a flat base, a bonding surface formed on said flat base at an inner side and bonded to one of two opposite sides of said memory chip, a mounting unit disposed at a top side of said flat base, and a plurality of retaining spring strips respectively extended from said flat base for securing said clamps, said mounting unit of one of said heat sinks being connectable to said mounting unit of the other of said heat sinks; said clamps are clamped on said two heat sinks at a top side, said clamps each having two clamping arms respectively clamped on one retaining spring strip of each of said two heat sinks, said clamping arms each having a retaining hole for the engagement of the associating retaining spring strip, wherein said flat base of each of said two heat sinks has a plurality of openings; said retaining spring strips of said two heat sinks are respectively suspended in said openings on said flat base of each of said two heat sinks.

2. The memory module and heat sink arrangement as claimed in claim 1, wherein said mounting unit of each of said two heat sinks comprises a plurality of locating plugs and a plurality of locating grooves, said locating plugs of said mounting unit of one of said two heat sinks being respectively engaged into said locating grooves of said mounting unit of the other of said two heat sinks.

3. The memory module and heat sink arrangement as claimed in claim 2, wherein said mounting unit of each of said two heat sinks further comprises a plurality of bearing blocks respectively disposed above said respective locating grooves, said bearing blocks of said mounting unit of one of said two heat sinks being respectively stopped against said locating plugs of said mounting unit of the other of said two heat sinks at a top side.

4. The memory module and heat sink arrangement as claimed in claim 1, wherein said two heat sinks each further comprise a plurality of stop blocks respectively protruded from said respective flat base at two sides for stopping said memory module in between said two heat sinks.

5. The memory module and heat sink arrangement as claimed in claim 1, wherein said retaining spring strips each have a free end terminating in a guide slope and then a retaining tip, said retaining tip being adapted to engage said retaining hole of said one clamping arm of one of said clamps, said guide slope being adapted to guide said retaining hole of said one clamping arm of one of said clamps into engagement with said retaining tip.

6. The memory module and heat sink arrangement as claimed in claim 1, wherein said two heat sinks each further comprises multiple pairs of guide blocks respectively protruded from said flat base of each of said two heat sinks at two sides of each of said retaining spring strips.

7. The memory module and heat sink arrangement as claimed in claim 1, further comprising a heat transfer compound applied to said bonding surface of said flat base of each of said two beat sinks.

* * * * *